US006774460B1

(12) United States Patent
Herbert et al.

(10) Patent No.: US 6,774,460 B1
(45) Date of Patent: Aug. 10, 2004

(54) IMPATT DIODES

(75) Inventors: David C Herbert, Malvern (GB); Robert G Davis, Durham (GB)

(73) Assignee: Qinetiq Limited, London (GB)

( * ) Notice: Subject to any disclaimer, the term of this patent is extended or adjusted under 35 U.S.C. 154(b) by 0 days.

(21) Appl. No.: 09/807,515

(22) PCT Filed: Oct. 22, 1999

(86) PCT No.: PCT/GB99/03428

§ 371 (c)(1),
(2), (4) Date: Apr. 16, 2001

(87) PCT Pub. No.: WO00/25366

PCT Pub. Date: May 4, 2000

(30) Foreign Application Priority Data

Oct. 23, 1998 (GB) .............................................. 9823115

(51) Int. Cl.[7] .................. H01L 29/864; H01L 31/0328; H01L 29/06
(52) U.S. Cl. ........................... 257/604; 257/19; 257/20; 257/22; 257/24; 257/27; 257/186; 257/199; 438/91; 438/199; 438/380
(58) Field of Search .............................. 257/19, 20, 22, 257/24, 27, 186, 199, 604; 438/91, 199, 380

(56) References Cited

U.S. PATENT DOCUMENTS 5,466,965 A * 11/1995 Meng et al. ................. 257/604

FOREIGN PATENT DOCUMENTS

| EP | 0 262 346 | 4/1988 |
| EP | 0 757 392 | 2/1997 |
| GB | 2 002 579 | 2/1979 |

OTHER PUBLICATIONS

J.K.Mishra et al., "Design Optimization of a single–sided Si?SiGe heterostrucutre mixed tunneling avalanche transist time double drift region", Semiconductor Sci. Tech. 12 (1997) 1635–1640.*

Mishra J K et al.: "Design optimization of a Single–sided SI/SIGE heterostructure mixedtunnelling avalanche transit time double drift region" Semiconductor Science and Technology, GB, Institute of Physics, London, vol. 12, No. 12, pp. 1635–1640.

Mishra J K et al.: "An extremely low noise heterojunction impatt" IEEE transactions on election devices, US, IEEE Inc. New York, vol. 44, No. 12, pp. 2143–2148.

Kearney M. J.: "Heterojunction impact avalanche transit–time diodes grown by molecular beam epitaxy" Semiconductor Science and Technology, GB, Institute of Physics. London, vol. 8, No. 4, pp. 560–567.

* cited by examiner

Primary Examiner—Donghee Kang
(74) Attorney, Agent, or Firm—Nixon & Vanderhye P.C.

(57) ABSTRACT

The present invention relates to an impact ionisation avalanche transit time (IMPATT) diode device comprising an avalanche region and a drift region, wherein at least one narrow bandgap region, with a bandgap narrower than the bandgap in the avalanche region, is located adjacent to or within the avalanche region in order to generate within the narrow bandgap region a tunnel current which is injected into the avalanche region. This improves the predictability with which a current can be injected into the avalanche region and enables a relatively narrow pulse of current to be injected into the avalanche region in order to enable a relatively noise free avalanche multiplication. The narrow bandgap region may be located between a heavily doped contact region and the avalanche region and is preferably arranged to generate a tunnel current at the peak reverse bias applied to the diode.

19 Claims, 5 Drawing Sheets

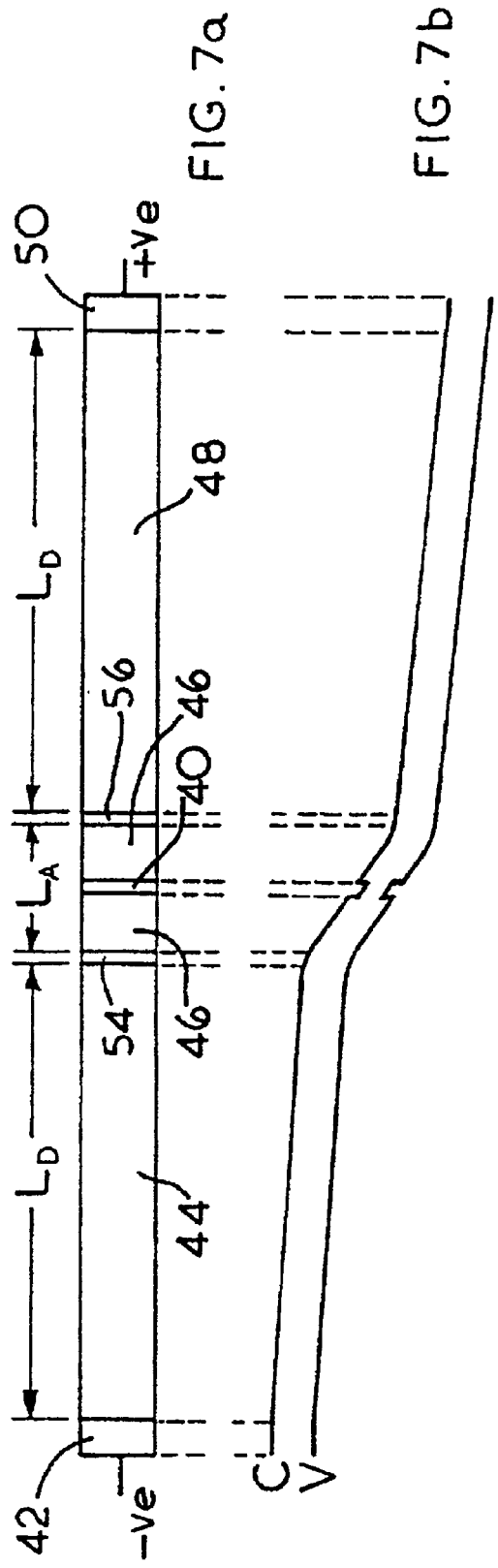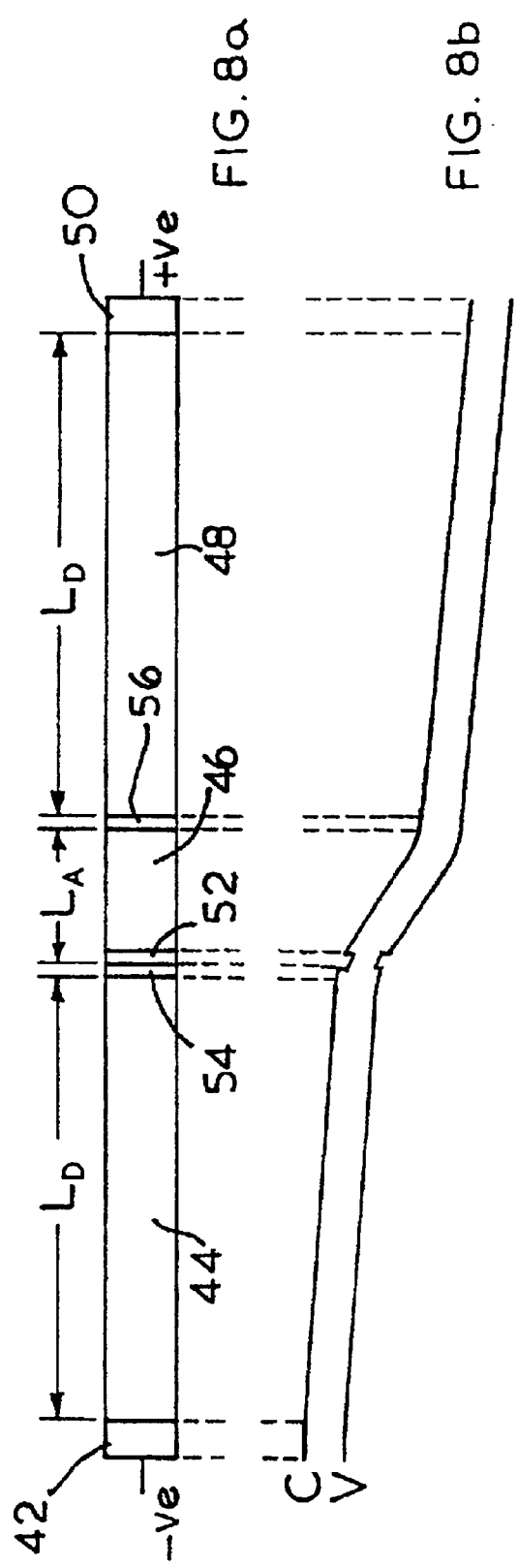

IMPATT DIODES

This application is the US national phase of international application PCT/GB99/03428, filed in English on Oct. 22, 1999 which designated the U.S. PCT/GB99/03428 claims priority to GB Application No. 9823115.2 filed Oct. 23, 1998. The entire contents of these applications are incorporated herein by referrence.

BACKGROUND OF THE INVENTION

1. Field of the Invention

The present invention relates to semiconductor avalanche diodes, and in particular to IMPATT (impact ionisation avalanche transit time) diodes.

2. Discussion of Prior Art

IMPATT diodes employ the impact-ionisation and transit time properties of semiconductor structures to produce negative resistance at microwave frequencies. An IMPATT diode consists of heavily doped $n^{++}$ and $p^{++}$ contact regions separated by a depleted region with a doping m profile designed to produce an avalanche region and a drift region. The doping profile is designed to produce an avalanche region with a high electric field, sufficient to generate high multiplication levels by impact ionisation. The doping profile is designed to produce a drift region with an electric field sufficiently high to achieve carrier velocity saturation but sufficiently low to avoid impact ionisation.

A common example of an IMPATT diode has a lo-hi-lo doping profile in which the $p^{++}$ contact region is followed by a n-type doped region, in which a first layer (adjacent to the $p^{++}$ contact region) has a low doping concentration (n), a second layer has a high doping concentration ($n^+$) and a third layer has a low doping concentration (n). The first layer is the avalanche region and sustains a high electric field, the second layer is a doping spike to switch the electric field from a high value in the first layer to a lower value in the third layer, which is the drift region. The avalanche region of the diode will break down when the applied reverse bias voltage exceeds a threshold value.

Close to the breakdown voltage a rapid increase in current is caused by avalanche multiplication of holes and electrons in the avalanche region.

If an IMPATT device is mounted in a microwave cavity and a reverse bias voltage close to the breakdown voltage is applied, then the cavity can be tuned to allow the negative resistance of the diode to generate microwave oscillations with the diode voltage swinging above and below the breakdown voltage. When the rf voltage rises above zero (in its positive half cycle), an avalanche is initiated, a small number of holes and electrons arising from the reverse saturation current are greatly multiplied by the avalanche process. IMPATT diodes are normally designed so that the avalanche current peaks as the rf voltage approaches zero (towards the end of its positive half cycle). After passing through the avalanche region the electrons are swept into the low doped drift region and after a transit time delay the electrons are collected at the $n^{++}$ contact region. Thus, the current resulting from the avalanche transits the drift region for the half period (negative half cycle) when the rf voltage is negative and this yields a negative resistance for rf current.

The IMPATT diode is one of the most powerful solid-state sources of microwave power. Continuous wave (CW) output powers as high as 10 W at a few gigahertz and as high as 1 W at 100 GHz can be obtained from a single IMPATT diode device. However, IMPATT diodes are noisy and sensitive to operating conditions. The noise in an IMPATT diode arises mainly from the statistical nature of the generation rates of electron-hole pairs at and above the breakdown voltage. Noise can be reduced somewhat by operating an IMPATT diode well above the resonant frequency of the diode and keeping the current low. However, these conditions conflict with conditions favouring high power output and efficiency. Examples of IMPATT diodes are discussed in GB2,002,579 and EP757,392.

Partly, because of the high noise associated with IMPATT diodes, three terminal signal generators, such as transistors are preferred at microwave frequencies with subsequent up-conversion and low noise amplification for higher frequencies. However, the high parasitics associated with three terminal structures indicates that two terminal devices, such as IMPATT diodes, would have a natural advantage at microwave and mm-wave frequencies if noise could be reduced.

MITTAT (mixed tunnelling avalanche transit time) IMPATT diodes are also known in which both tunnelling and ionisation effects are strong in the avalanche region, for example in EP262,346 and U.S. Pat. No. 5,466,965. This degrades efficiency as a significant proportion of the generated tunnel current undergoes little or no avalanche multiplication.

SUMMARY OF THE INVENTION

The present invention seeks to overcome some of the problems discussed above by providing an IMPATT diode which operates with much reduced noise levels.

According to a first aspect of the present invention there is provided an impact ionisation avalanche transit time (IMPATT) diode device comprising a main avalanche region and a drift region wherein the deuce additionally comprises a narrow bandgap region with a bandgap narrower than the bandgap in the main avalanche region which narrow bandgap region is located adjacent to the main avalanche region in order to generate within the narrow bandgap region a tunnel current which is Injected into the main avalanche region. By incorporating a narrow bandgap region adjacent to the main avalanche region an injection tunnel current pulse can be generated in a predictable manner. This current pulse is injected Into the main avalanche region where a low noise avalanche occurs.

Preferably, the narrow bandgap region is arranged to generate a tunnel current for injection into the main avalanche region at the peak reverse bias voltage of an oscillating voltage applied across the terminals of the diode.

It is preferred that the narrow bandgap region is located at the edge of the main avalanche region.

The doping profile of an IMPATT diode according to the present invention must be designed to achieve an electric field across the narrow bandgap region of sufficient magnitude to provide the desired tunnel current amplitude at the peak reverse bias voltage. For strained semiconductor materials such as Silicon Germanium/Silicon, a plurality of alternating narrow and wide bandgap layers may have to be used to form the narrow bandgap region in order to alleviate strain. However, In unstrained materials such as Galium Arsenide/Aluminium Gallium Arsenide, one narrow bandgap layer may be used to form the narrow bandgap region.

Most of the noise associated with a conventional IMPATT diode occurs due to the statistical nature of the generation of electron-hole pairs during the part of the positive half cycle of the oscillating voltage when the voltage is above the threshold breakdown voltage. The diode structure according to the present invention increases the predictability of electron-hole pairs being generated at voltages above the breakdown voltage and so can enable a low noise narrow pulse of current to be generated close to the time at which the oscillating bias becomes negative.

The IMPATT diode according to the present invention may have a single drift form, for example having a lo-hi-lo doping profile or a Misawa p-i-n doping profile. Alternatively, the diode according to the present invention may be a double drift diode. In a preferred embodiment of the present invention particularly suitable for a single drift diode the narrow bandgap region is located between a heavily doped contact region and the main avalanche region so as to maximise the proportion of the avalanche region which can be used to multiply the electrons generated in the narrow bandgap material. In a preferred embodiment of the present invention particularly suitable for a double drift diode the narrow bandgap region may be located towards the centre of the avalanche region, so that both the n and p components of the tunnel current may undergo avalanche multiplication.

The IMPATT diode according to the present invention may be made of either III–V semiconductor materials, such as Gallium Arsenide/Aluminium Gallium Arsenide, or group IV semiconductor materials, such as Silicon Germanium/Silicon. The thickness of the narrow bandgap region and the composition of the alloys making up the narrow bandgap region are design parameters chosen to achieve the required tunnel current, as will be apparent to the person skilled in the art.

According to a further preferred embodiment of the present invention the length of the drift region ($L_D$) and the length of the avalanche region ($L_A$) are chosen such that the drift region is between 2 and 6 times, and more preferably between 3.5 and 4.5 times, the length of the avalanche region. This ensures that in the fundamental mode of oscillation, the period of oscillation (P) is between 4 and 12 times, and preferably close to 8 times (between 7.5 and 8.5 times), the avalanche region transit time ($T_A$). It has been found that this substantially reduces the noise generated by an IMPATT diode according to the present invention.

The IMPATT diode according to the present invention can be arranged such that at least part of the tunnel current is generated by optical excitation.

BRIEF DESCRIPTION OF THE DRAWINGS

The present invention will now be described with reference to the following Figures in which:

FIG. 7a shows the structure of a first embodiment of a double drift IMPATT diode according to the present invention.

FIG. 7b graphically illustrates the variation in conduction band and valence band edge energies along the IMPATT diode of FIG. 7a.

FIG. 8a shows the structure of a second embodiment of a double drift IMPATT diode according to the present invention.

FIG. 8b graphically illustrates the variation in conduction band and valence band edge energies along the IMPATT diode of FIG. 8a.

DETAILED DISCUSSION OF EMBODIMENTS

Figure 1:
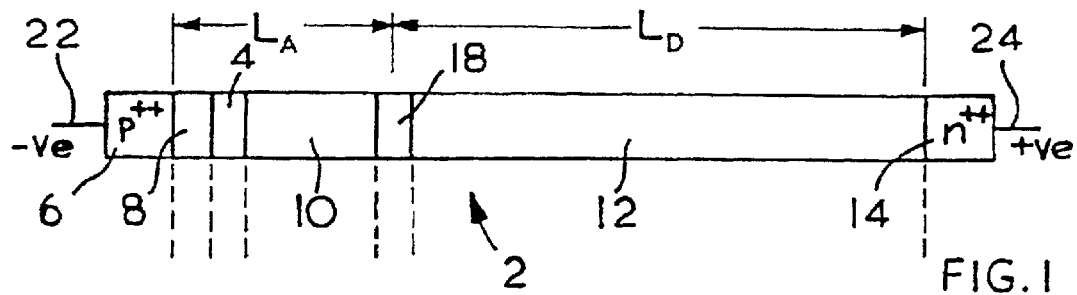
FIG. 1 shows the structure of a single drift IMPATT diode according to the present invention.

The IMPATT diode (2) shown in FIG. 1 is a lo-hi-lo type IMPATT diode, having a heavily doped $p^{++}$ contact region (6), low doped semiconductor regions (8), (10) and (12) and a heavily doped $n^{++}$ contact region (14). However, according to the present invention a narrow band gap region (4) is located between the low doped region (8) and the low doped region (10).

The material compositions, layer thicknesses and doping used in the IMPATT diode (2) is selected to generate a desired level of tunnel current at the peak reverse bias voltage applied to the diode (2).

The narrow bangap region (4) makes it easier for electrons to tunnel from the valence band (V) to the conduction band (C) and is effective to inject electrons into the conduction band of the wide bandgap region (10) in a predictable manner. This is shown by the arrow in FIG. 2. The electrons injected into the wider bandgap region (10) then undergo avalanche multiplication in the avalanche region (10).

An n-type doping spike (18) separates the low doped region (10) and the low doped region (12) and so forms the boundary between the avalanche region (10) and the drift region (12) of the device (2).

The avalanche region is the region where the impact ionisation is significant and will extend into region (8) although it is unlikely to include all of region (8). As can be seen from FIG. 2 the narrow bandgap region (4) is located within the conventional avalanche region and can be considered as part of the avalanche region.

The $p^{++}$ and $n^{++}$ contact regions should have sufficiently high doping levels to form good Ohmic contacts with the metalisation layer of the diode, as is well known in the art. Alternative contact technologies could be used, e.g. the $p^{++}$ region could be replaced by an $n^+$ region to form a Shottky barrier with the metalisation layer.

Figure 2:
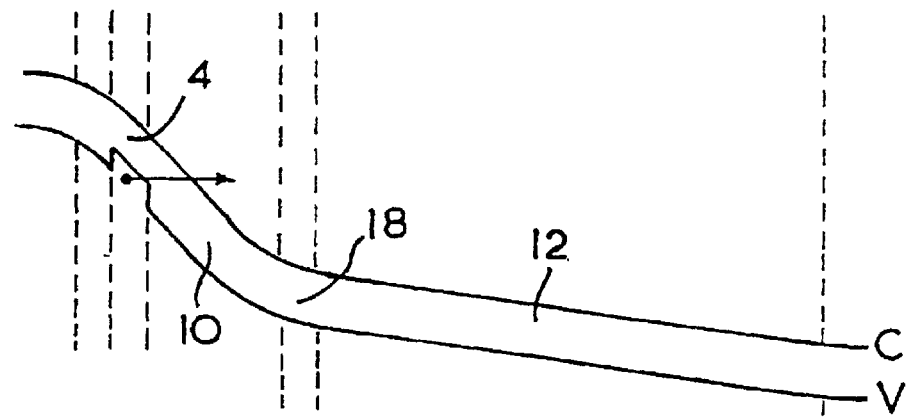
FIG. 2 graphically illustrates the variation in conduction band and valence band edge energies along the IMPATT diode of FIG. 1 showing injection by electron tunnelling.

FIG. 2 shows the variation in conduction band (C) and valence band (V) edge energies along the IMPATT diode of FIG. 1. This is similar to that of a conventional lo-hi-lo diode except for the narrow bandgap region (4) which makes it easier for an electron to tunnel from the valence band to the conduction band at applied reverse bias voltages above the breakdown voltage in order to inject electrons into the region (10). This tunnelling is indicated by the arrow in FIG. 2. The gradual reduction in energy of the valence and conduction bands, from left to right in FIG. 2, across the intrinsic region (10) means that electrons injected into the intrinsic region (10) undergo avalanche multiplication. It can be seen that the n-type doping spike (18) terminates the avalanche region of the device (2).

The length of the drift region (12) $L_D$ and the length of the avalanche region ($L_A$) are chosen such that in the fundamental mode of rf oscillation across the electrodes (22) and (24), the period of oscillation (P) of the fundamental mode is between 4 and 12 times, and preferably close to 8 times the avalanche region transit time ($T_A$), ie. the time it takes for an electron to transit the avalanche region (10). It has been found that this substantially reduces the noise generated by an IMPATT diode. This applies to conventional IMPATT diodes as well as to IMPATT diodes having a narrow bandgap region.

Figure 6:
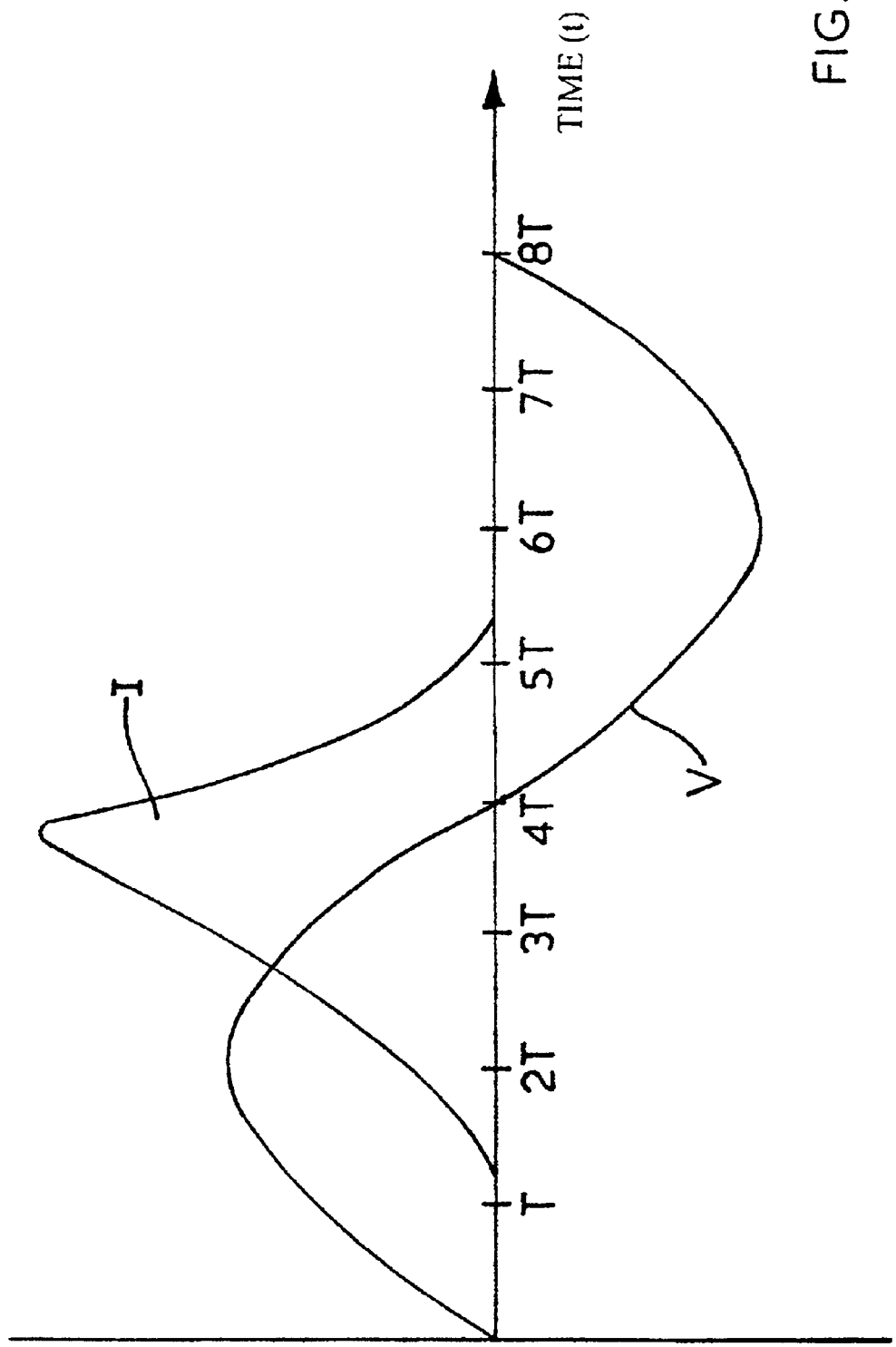
FIG. 6 shows the current waveform (I) generated in the device of FIG. 1 by tunnelling and avalanche as a function of time.

If the fundamental mode of rf voltage oscillation (having a period of oscillation P) begins at t=0, as shown in FIG. 6, then an IMPATT diode is generally designed so that the current from the avalanche region enters the drift region (12) after a time t=P/2 (t=4T in FIG. 6), ie. when the fundamental mode of voltage oscillation (V) ends its positive voltage half cycle. In order to achieve maximum negative resistance IMPATT diodes are generally designed so that the transit time through the drift region is close to P/2. Accordingly, the length of the drift region is generally chosen to be $L_D=V_S P/2$, where $V_S$ is the saturated electron drift velocity. The length of the avalanche region will be $L_A=T_A/V_S$, where $T_A$ is the time it takes for an electron to transit the avalanche region, ie. the avalanche region transit time.

Thus when $P=8T_A$, then because $L_D=V_S P/2$ and $T_A=L_A/V_S$ as discussed above, this leads to the relationship;

$$L_D=4T_A V_S=4L_A,$$

that is, the drift region length $L_D$ is 4 times the avalanche region length $L_A$. It has been found that this substantially reduces the noise generated by an IMPATT diode according to the present invention.

To demonstrate the principle of the present invention a Silicon Germanium/Silicon based structure according to FIG. 1 has been simulated. Where the fraction of Germanium in the Silicon Germanium alloy is denoted by x, the narrow bandgap region (4) was made of a 200 A (Angstrom) thick layer of Silicon Germanium with x=0.33. The low doped region (8,10) was made of a 2000 A thick layer of intrinsic Silicon. To reduce the strain in the Silicon Germanium layer (4) for stable operation at high power it may be necessary to add Carbon to the Silicon Germanium alloy. For this particular alloy layer thickness and composition it was found that including the Silicon Germanium layer (4) as the first part of an intrinsic avalanche layer (8,10) as indicated in FIG. 1 gave a satisfactorily high tunnel current. The magnitude and thickness of the doping spike (18) was chosen to give an average electric field in the avalanche region (10) of $5\times10^5$ V/cm. The amplitude of the time variation of the field was taken as 50% of the average field (ie. A=0.5 see below) which gave a peak tunnel current of approximately 1.5 amps/cm².

Where the narrow band gap region (4) is SiliconGermanium (SiGe) the injection of tunnel current will use the indirect SiGe bandgap. Semiconductor materials, such as, GaAs/AlGaAs or InGaAs/InP or other hetero systems could be used to implement the device (2) shown in FIG. 1 such that a tunnel current is injected into the avalanche region at peak reverse bias. Si has the advantage of high thermal conductivity and demonstrated performance at high frequencies up to 300 GHz.

The device (2) is reverse biased by applying a constant reverse bias voltage across electrodes (22) and (24) which voltage is close to the reverse bias breakdown voltage of the device. In addition an oscillating voltage variation is generated across the electrodes (22) and (24) by locating the diode (2) in a microwave cavity and appropriately tuning the cavity. As is well known in the art alternative resonant circuits may be used. The inclusion of the narrow band gap region (4) ensures that a relatively high tunnel current is injected into the avalanche region (16) at the peak reverse bias voltage.

Without the narrow bandgap region this injection arises from the reverse saturation current which normally has very low values such that the number of particles available to initiate an avalanche is low, often less than 1, with consequent high statistical fluctuation. The tunnel current is designed to be much higher, yielding much lower noise prior to avalanche.

The tunnel current consists of electrons and holes, and referring to FIG. 1, the electrons flow into the avalanche region (10) and the holes flow into the $p^{++}$ region (8). The electrons flowing into the avalanche region (10) then generate electrons and holes in the Si avalanche region (10) by impact ionisation.

The injected tunnel current is generated entirely in the SiGe narrow bandgap region (4) and comprises a narrow pulse of charge carriers close to the peak reverse bias voltage which pulse of charge carriers is then injected into the Si avalanche region (10). The relatively narrow pulse of injected tunnel current has low statistical fluctuation and will initiate a very low noise avalanche multiplication in the avalanche region (10). The structure of the diode (2) enables a relatively high tunnel current to be injected into the avalanche region (10). Also, because the inclusion of the narrow bandgap region (4) makes it easier for electrons to move from the valence band (V) into the conduction band (C) the diode (2) can be operated at lower electric fields and multiplication values than for a conventional lo-hi-lo type IMPATT diode with similar power outputs. This will yield an improvement in reliability and efficiency.

Figure 5:
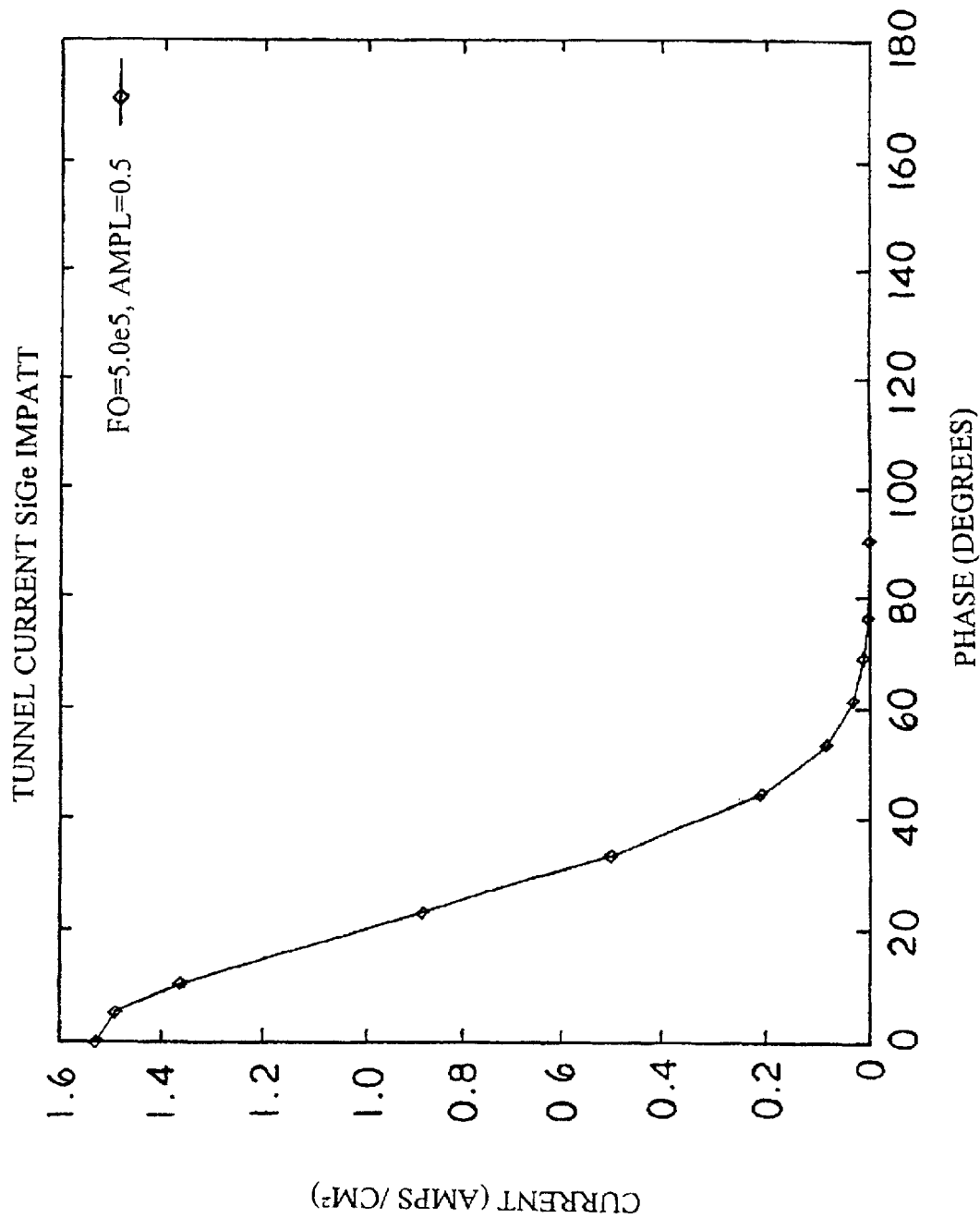
FIG. 5 shows the tunnel current generated in the device of FIG. 1 as a function of phase angle where the origin on the horizontal axis of the plot is chosen as 90°, i.e. at the positive peak of the voltage cycle.

As indicated above in a preferred embodiment, the narrow bandgap layer (4) is made of a 200 A thick layer of 33% Silicon Germanium and the avalanche region (8,10) is made of a 2000 A thick layer of Silicon. The fundamental oscillation of the voltage (V) generated across the device (2) will take the form;

$$V=V_0[1+A \cos(\omega t)]$$

with A=a constant multiplier which is less than 1,
$V_0$=a reverse bias voltage close to the breakdown voltage, and
$V_0 A \cos(\omega t)$=a sinusoidal voltage,
as is described above. In this case the tunnel current shown in FIG. 5 is obtained. In FIG. 5 the phase origin of the horizontal axis (ie. phase=0) is chosen to correspond to the peak reverse bias voltage applied across the electrodes (22) and (24). This peak reverse bias occurs at t=2T on FIG. 6, at a 90° phase lag relative to the origin of the rf voltage oscillation at t=0 on FIG. 6. The tunnel current is generated entirely in the narrow bandgap region (4) and forms a pulse close to the peak reverse bias voltage which is then injected into the Si avalanche region (10). From FIG. 5, it is expected that the tunnel current will approach 1.6 amp/cm² in the structure of FIG. 2 and should give very low noise avalanche multiplication.

It will be understood by the person skilled in the art that the magnitude of the tunnel current shown in FIG. 5 can be varied by changing the thickness or alloy composition of the narrow bandgap layer (4), possibly using multi-quantum wells to alleviate strain. It is also possible to design the doping profile or to use doping spikes to change the electric field across the narrow bandgap region (4) relative to the field across the avalanche region (10).

The origin of phase is defined as the point at which the rf voltage is zero and about to rise (ie. t=0 in FIG. 6). The peak tunnel current coincides with the peak electric field which occurs at a phase of 90° (ie. t=2T in FIG. 6). The avalanche multiplication is arranged so the total current (ie. tunnel plus avalanche current—I in FIG. 6) normally peaks close to a phase of 180° (ie. t=4T in FIG. 6) at which the oscillating rf voltage passes through zero to become negative.

As indicated above, the device (2) is reverse biased to just below the breakdown voltage and a periodic voltage is generated across the electrodes (22) and (24). Thus, towards the peak of the positive half cycle of the sinusoidal voltage, the voltage generated across the electrodes (22) and (24) is greater than the breakdown voltage. The avalanche noise is suppressed most effectively when the period of oscillation of the fundamental mode of voltage oscillation is approximately eight times the avalanche zone transit time, ie. eight times the time it takes a charge carrier to pass through the avalanche zone (10).

Figure 4:
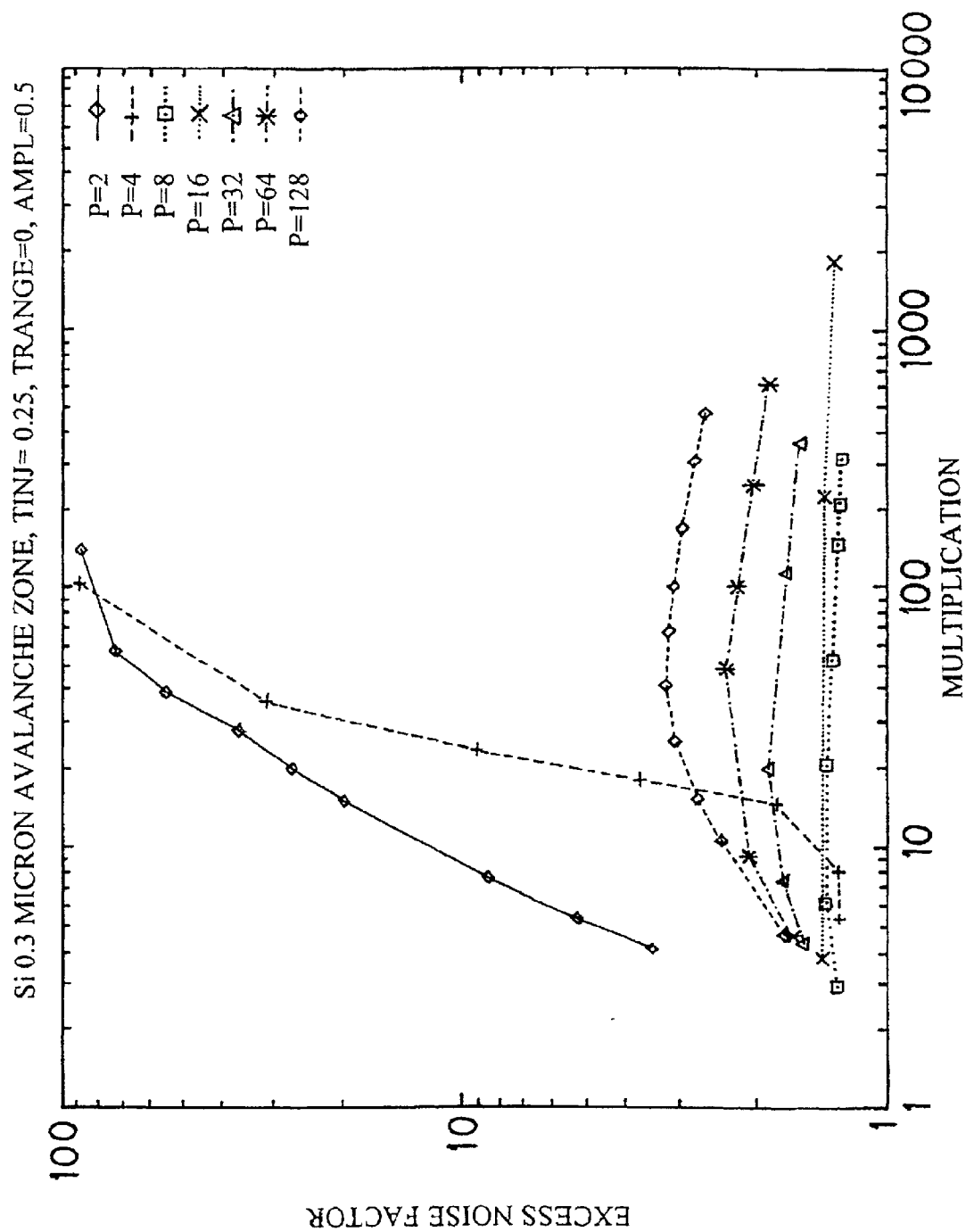
FIG. 4 shows the variation of noise with multiplication factor for the device shown in FIG. 2 for different periods of the fundamental mode of a generated voltage oscillation.

In FIG. 4 is shown a graph of the computed noise of a device (2) as a function of the multiplication factor of the avalanche region (10) for various periods of oscillation of the sinusoidal voltage applied across the electrodes (22) and (24). The device simulated was a Silicon lo-hi-lo diode having the structure shown in FIG. 1 and having a 0.3 micron thick avalanche region (10) with a Silicon Germanium narrow bandgap layer. It can be seen from the FIG. 4 graph that the noise at high multiplication levels is reduced when the period of oscillation approaches eight times the avalanche zone transit time, ie. $P=8T_A$ (indicated as P=8 in FIG. 4). The excess noise factor at $P=8T_A$ decreases as the multiplication factor increases and can achieve almost noise free multiplication.

In FIG. 6 is plotted the total current waveform (I) consisting of tunnel current and avalanche current for the device of FIG. 2 when the sinusoidal voltage (V), also shown in FIG. 6, has a period of P=8T. The current (I) starts to rise at time t=2T which corresponds to the peak reverse bias voltage (V) of the applied sinusoidal voltage applied across the electrodes (22) and (24) of the device (2). The total current (I) goes through a maximum close to t=4T which corresponds to the time at which the sinusoidal voltage (V) becomes negative.

By using relatively high tunnel currents, efficient power generation should be possible with relatively low multiplication factors, so that the device (2) can be operated with a lower voltage drop across the avalanche zone. This should improve both efficiency and reliability.

Figure 3:
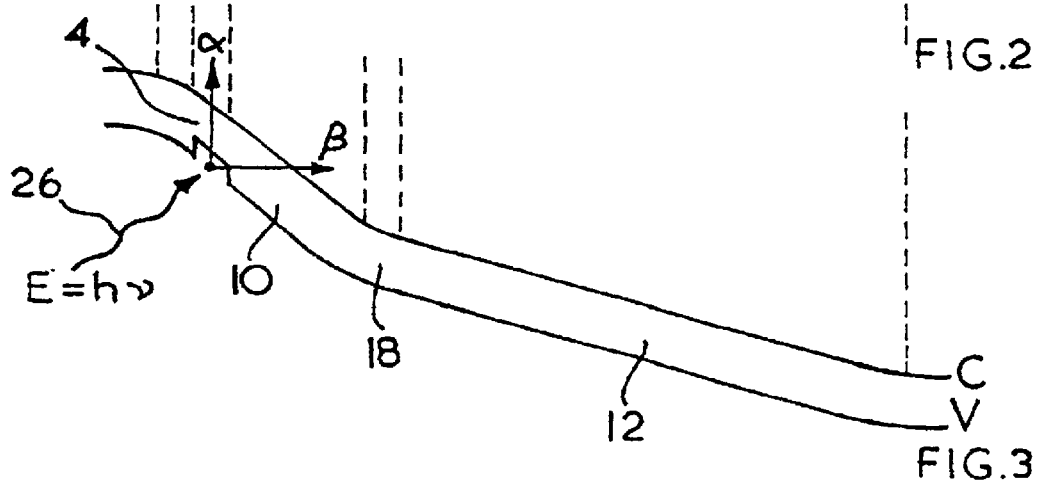
FIG. 3 graphically illustrates the variation in conduction band and valence band edge energies along the IMPATT diode of FIG. 1 showing injection by optical excitation.

FIG. 3 shows the variation in conduction band (C) and valence band (V) edge energies for the device of FIG. 1 (assuming Silicon Germanium as the narrow bangap region), except that in this case injection of electrons from the valence band and into the conduction band occurs by optical excitation (represented by arrow α of FIG. 3) of the electrons in the narrow bandgap layer as well as by electron tunnelling (represented by arrow β of FIG. 3). If electromagnetic radiation with an energy greater than the bandgap of the narrow bandgap material (4) is incident on the narrow bandgap region (4), electrons in the valence band (V) of the narrow bandgap region can absorb a photon (26) of the electromagnetic radiation and jump into the conduction band (C). Excitation in the narrow bandgap region could be done by horizontal access (wave guide) geometries to enhance optical absorption. The narrow bandgap region (4) makes it easier for an electron to jump from the valence band to the conduction band in order to inject electrons into the avalanche region (10). This optical excitation is indicated by the arrow α in FIG. 3.

Doping spikes can be used to adjust the electric field across the narrow bandgap layer to achieve the desired ratio of the injection current generated by optical excitation to the injection current generated by tunnelling. There is then a potential for optical injection locking of isolated diodes or arrays of diodes of the type shown in FIG. 1 and optical control of the phase and amplitude of the signal output from the diode (2).

Figure 9:
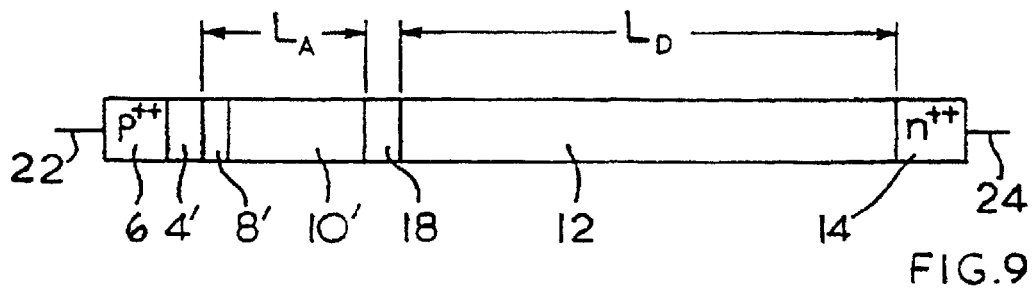
FIG. 9 shows the structure of a single drift IMPATT diode according to an alternative embodiment of the present invention.

Alternatively, as is shown in FIG. 9, the narrow bandgap region (4') can be adjacent to but outside of the avalanche region (10'). In this case a doped region (8') will be required between the narrow bandgap region (4') and the avalanche region (10') in order to change the relative electric fields.

The above description has related to single drift diodes as shown in FIG. 1, but the present invention can also be applied to double drift diodes, such as that shown in FIGS. 7a and 8a. The diodes shown in FIGS. 7a and 8a are fabricated from a Gallium Arsenide/Aluminium Gallium Arsenide structure.

The double drift IMPATT diodes shown in FIGS. 7a and 8a have heavily doped $p^{++}$ region (42), low doped semiconductor regions (44), (46) and (48) and a heavily doped $n^{++}$ region (50). Region (46) comprises the avalanche region and regions (44) and (48) comprise the two drift regions. A p-type doping spike (54) and an n-type doping spike (56) separate the avalanche region (46) from the drift regions (44) and (48). In the diode shown in FIG. 7a a Gallium Arsenide narrow bandgap region (40) is located in the centre of the avalanche region (46). In the diode shown in FIG. 8a a Gallium Arsenide narrow bandgap region (52) is located to the left hand side of the avalanche region (46). As described above in relation to the single drift diode of FIG. 1, the narrow bandgap regions (40) and (52) make it easier for electrons to tunnel from the valence band (V) to the conduction band (C) in order to reliably inject a tunnel current into the avalanche region.

The material compositions, layer thickness and doping used in the structures of FIGS. 7a and 8a are selected to generate a desired level of tunnel current at peak reverse bias voltage and appropriate electric field levels in the avalanche region to ensure a desired avalanche multiplication by impact ionisation and in the drift regions to ensure that carriers achieve saturation velocity. As indicated above it is preferred that each drift region (44) and (48) has a length approximately four times the length of the avalanche region (46). Thus, in the fundamental mode of oscillation the period of the fundamental oscillation will be approximately eight times the transit time of the avalanche region, as discussed above in relation to the diode of FIG. 1.

FIGS. 7b and 8b show the variation in conduction band (C) and valence band (V) edge energies along the IMPATT diodes of FIGS. 7a and 8a respectively. These are similar to the conduction and valence band edge energies of a conventional double drift diode except for the edge energies at the respective narrow bandgap regions (40) and (52).

What is claimed is:

1. An impact ionisation avalanche transit time (IMPATT) diode device comprising:
   an avalanche region;
   a drift region; and
   a narrow bandgap region with a bandgap narrower than the bandgap in the avalanche region which narrow bandgap region is located adjacent to the avalanche region in order to generate within the narrow bandgap region a tunnel current which is injected into the avalanche region.

2. An IMPATT diode according to claim 1 wherein the narrow bandgap region is arranged to generate a tunnel current for injection into the avalanche region at the peak reverse bias voltage applied to the diode.

3. An IMPATT diode according to claim 1 wherein the narrow bandgap region is located at the edge of the avalanche region.

4. An IMPATT diode according to claim 1, wherein the narrow bandgap region is located between a heavily doped contact region and the avalanche region.

5. An IMPATT diode according to claim 1, wherein the narrow bandgap region comprises one layer of narrow bandgap material.

6. An IMPATT diode according to claim 1, wherein the narrow bandgap region comprises a plurality of layers of narrow bandgap material.

7. An IMPATT diode according to claim 1, wherein the diode has a lo-hi-lo doping profile.

8. An IMPATT diode according to claim 7 wherein the diode is a Misawa p-i-n diode.

9. An IMPATT diode according to claim 1, wherein the diode is a double drift diode.

10. An IMPATT diode according to claim 1, wherein the diode is made of III–V semiconductor materials.

11. An IMPATT diode according to claim 10 wherein the narrow bandgap region is made of at least one layer of Gallium Arsenide and the avalanche region is made of Aluminium Gallium Arsenide.

12. An IMPATT diode according to claim 1, wherein the diode is made of group IV semiconductor materials.

13. An IMPATT diode according to claim 12 wherein the narrow bandgap region is made of at least one layer of Silicon Geranium and the avalanche region is made of Silicon.

14. An IMPATT diode according to claim 1, wherein the length of the drift region is between 2 and 6 times the length of the avalanche region.

15. An IMPATT diode according to claim 14 wherein the length of the drift region is between 3.5 and 4.5 times the length of the avalanche region.

16. An IMPATT diode according to claim 1, arranged such that at least part of the tunnel current can be generated by optical excitation.

17. A method of operating the IMPATT diode of claim 1, wherein an oscillating voltage across the diode has a period of between 4 and 12 times the transit time of the avalanche region.

18. A method according to claim 17 wherein the oscillating voltage has a period of between 7.5 and 8.5 times the transit time of the avalanche region.

19. A method according to claim 17 including the step of optically exiting at least part of the tunnel current.

* * * * *